US 11,129,283 B2

(12) United States Patent
Lee et al.

(10) Patent No.: US 11,129,283 B2
(45) Date of Patent: Sep. 21, 2021

(54) METHOD OF ELECTROPLATING A CIRCUIT BOARD

(71) Applicant: BOARDTEK ELECTRONICS CORPORATION, Taoyuan (TW)

(72) Inventors: Chien-Cheng Lee, Taoyuan (TW); Chung-Hsing Liao, Taoyuan County (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 303 days.

(21) Appl. No.: 16/356,425

(22) Filed: Mar. 18, 2019

(65) Prior Publication Data

US 2020/0170124 A1 May 28, 2020

(30) Foreign Application Priority Data

Nov. 28, 2018 (TW) .................................. 107142486

(51) Int. Cl.
*H05K 3/42* (2006.01)
*H05K 1/11* (2006.01)

(52) U.S. Cl.
CPC ............. *H05K 3/423* (2013.01); *H05K 1/115* (2013.01); *H05K 3/429* (2013.01); *H05K 2201/09563* (2013.01)

(58) Field of Classification Search
CPC ........ H05K 1/116; H05K 3/423; H05K 3/429; H05K 2201/09563
See application file for complete search history.

(56) References Cited

U.S. PATENT DOCUMENTS

| 5,659,951 A | 8/1997 | Gall et al. |
| 6,458,696 B1 * | 10/2002 | Gross .................. H01L 21/2885 205/131 |
| 6,708,404 B1 * | 3/2004 | Gaku ................... H05K 3/0038 29/852 |
| 7,909,976 B2 * | 3/2011 | Mashino ................ C25D 17/02 205/104 |
| 8,273,995 B2 * | 9/2012 | Chandrasekraran ........................ H05K 1/0245 174/262 |

(Continued)

FOREIGN PATENT DOCUMENTS

| CN | 1717152 A | 1/2006 |
| CN | 1758832 A | 4/2006 |

(Continued)

*Primary Examiner* — Carl J Arbes
(74) *Attorney, Agent, or Firm* — Li & Cai Intellectual Property (USA) Office

(57) ABSTRACT

An electroplating method of a circuit board includes: providing a multi-layer board having a conductive layer embedded therein; penetratingly forming a thru-hole and at least one penetrating hole in the multi-layer board, and forming a conductive portion on an inner wall defining the thru-hole and connected to the conductive layer, wherein the at least one penetrating hole is located at one side of the thru-hole, and an annular portion of the conductive layer exposed from the at least one penetrating hole is defined as an electroplated region; and electroplating the electroplated region to be formed with a metal post by applying a current to the conductive portion, wherein the metal post is filled in the at least one penetrating hole and is connected to the electroplated region.

11 Claims, 9 Drawing Sheets

(56) References Cited

U.S. PATENT DOCUMENTS

| | | | | |
|---|---|---|---|---|
| 8,541,695 B2* | 9/2013 | Ishida | ............... | H05K 1/0222 |
| | | | | 174/264 |
| 9,648,733 B2* | 5/2017 | Li | ............... | H05K 3/0032 |
| 10,076,044 B2* | 9/2018 | Yoshida | ............... | H05K 3/421 |
| 10,306,760 B2* | 5/2019 | Li | ............... | H05K 1/0306 |

FOREIGN PATENT DOCUMENTS

| | | |
|---|---|---|
| EP | 3205750 B1 | 10/2019 |
| WO | 9746063 A1 | 12/1997 |

* cited by examiner

METHOD OF ELECTROPLATING A CIRCUIT BOARD

CROSS-REFERENCE TO RELATED PATENT APPLICATION

This application claims the benefit of priority to Taiwan Patent Application No. 107142486, filed on Nov. 28, 2018. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a method for manufacturing a circuit board, and more particularly to an electroplating method of a circuit board and a circuit board manufactured by the same.

BACKGROUND OF THE DISCLOSURE

Referring to FIG. 1, a circuit board 100a manufactured by a conventional electroplating method is shown. The convention electroplating method is suitable for electroplating the circuit board 100a that needs to be formed with a longer metal post (e.g., a length of the longer metal post that is larger than 0.25 mm). Specifically, the convention electroplating method includes steps as follows. Two opposite board surfaces 11a of a board 1a are each formed with a slot 12a so as to allow a conductive layer 2a embedded in the board 1a to be a bottom of each of the slots 12a, and each of the slots 12a is electroplated to form a metal post arranged therein. Accordingly, the two metal posts and a portion of the conductive layer 2a sandwiched between the two metal posts are jointly used as the longer metal post. However, in the conventional electroplating method, the slot 12a is difficult to form, and the board 1a is not directly formed with a thru-hole for manufacturing the longer metal post, thereby increasing the manufacturing cost of the circuit board 100a.

SUMMARY OF THE DISCLOSURE

In response to the above-referenced technical inadequacies, the present disclosure provides an electroplating method of a circuit board and a circuit board manufactured by the same to effectively improve the issues associated with conventional electroplating methods.

In one aspect, the present disclosure provides an electroplating method of a circuit board implemented by: providing a multi-layer board, wherein the multi-layer board has a first board surface and a second board surface opposite to the first board surface, the multi-layer board includes a plurality of conductive layers embedded therein and a plurality of circuit layers embedded therein, and the circuit layers are respectively arranged at two opposite outer sides of the conductive layers; forming a thru-hole and at least one penetrating hole in the multi-layer board, and forming a conductive portion on an inner wall defining the thru-hole and connected to the conductive layers, wherein each of the thru-hole and the at least one penetrating hole penetrate through the multi-layer board from the first board surface to the second board surface, the conductive portion is electrically isolated from the circuit layers, a cross section of the at least one penetrating hole is in a circular shape, a depth of the at least one penetrating hole is larger than a diameter of the at least one penetrating hole, and the at least one penetrating hole is located at one side of the thru-hole, and wherein an annular portion of each of the conductive layers exposed from the at least one penetrating hole is defined as an electroplated region, and an annular portion of each of the circuit layers exposed from the at least one penetrating hole is defined as an attached region; and electroplating the electroplated regions to form a metal post by applying a current to the conductive portion, wherein the at least one penetrating hole is entirely filled by the metal post, and the metal post is connected to the electroplated regions and the attached regions.

In certain embodiments, in the electroplating of the electroplated regions, a metal portion is formed on the electroplated regions, and then extends to the attached regions, so that the metal portion simultaneously extends from the electroplated regions and the attached regions to form the metal post.

In certain embodiments, the multi-layer board includes an insulating portion and two metal layers, the conductive layers and the circuit layers are spaced apart from each other and are embedded in the insulating portion, the two metal layers are respectively disposed on a top surface and a bottom surface of the insulating portion, and outer surfaces of the two metal layers are respectively defined as the first board surface and the second board surface.

In certain embodiments, the insulating portion includes an inner surface defining part of the at least one penetrating hole. Before the electroplated regions are electroplated, the top surface of the insulating portion has a first reserved region that is exposed from the corresponding metal layer and connected to the inner surface, the bottom surface of the insulating portion has a second reserved region that is exposed from the corresponding metal layer and connected to the inner surface, a first protecting layer is formed on and covers the first board surface and the first reserved region, and a second protecting layer is formed on and covers the second board surface and the second reserved region.

In certain embodiments, a portion of the first protecting layer covering the first reserved region and a portion of the second protecting layer covering the second reserved region each have an inner edge that is flush with the inner surface of the insulating portion.

In certain embodiments, a thickness of the multi-layer board is larger than 0.3 mm, the electroplated regions are arranged in a middle portion of the at least one penetrating hole, and any two of the electroplated regions adjacent to each other have a distance there-between that is within a range of 50-150 μm.

In one aspect, the present disclosure provides a circuit board, manufactured by the electroplating method.

In one aspect, the present disclosure provides an electroplating method of a circuit board implemented by: providing a multi-layer board, wherein the multi-layer board has a first board surface and a second board surface opposite to the first board surface, and the multi-layer board includes a conductive layer embedded therein; forming a thru-hole and at least one penetrating hole in the multi-layer board, and forming a conductive portion on an inner wall defining the thru-hole and connected to the conductive layer, wherein each of the thru-hole and the at least one penetrating hole penetrate through the multi-layer board from the first board surface to the second board surface, a cross section of the at least one penetrating hole is in a circular shape, a depth of the at least one penetrating hole is larger than a diameter of the at least one penetrating hole, and the at least one penetrating hole is located at one side of the thru-hole, and wherein an annular portion of the conductive layer exposed from the at least one penetrating hole is defined as an electroplated region; and electroplating the electroplated region to form a metal post by applying a current to the conductive portion, wherein the at least one penetrating hole is entirely filled by the metal post, and the metal post is connected to the electroplated region.

In certain embodiments, a thickness of the multi-layer board is larger than 0.3 mm, the thru-hole and the at least one penetrating hole are formed by a mechanical drilling, and the electroplated region is arranged in a middle portion of the at least one penetrating hole.

In certain embodiments, the multi-layer board includes an insulating portion and two metal layers, the conductive layer is embedded in the insulating portion, the two metal layers are respectively disposed on a top surface and a bottom surface of the insulating portion, outer surfaces of the two metal layers are respectively defined as the first board surface and the second board surface, and the insulating portion includes an inner surface defining part of the at least one penetrating hole. Before the electroplated region is electroplated, the top surface of the insulating portion has a first reserved region that is exposed from the corresponding metal layer and is connected to the inner surface, the bottom surface of the insulating portion has a second reserved region that is exposed from the corresponding metal layer and is connected to the inner surface, a first protecting layer is formed on and covers the first board surface and the first reserved region, and a second protecting layer is formed on and covers the second board surface and the second reserved region.

Therefore, the electroplating method and the circuit board manufactured by the same in the present disclosure can each allow the multi-layer board to be directly formed with a circular penetrating hole, and the at least one electroplated region in the penetrating hole can be electroplated to form a metal post that entirely fills the penetrating hole. Accordingly, the electroplating method of the present disclosure can be implemented to directly form a circular penetrating hole in the multi-layer board, so that the production efficiency of the circuit board can be effectively increased, and the manufacturing cost of the circuit board can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
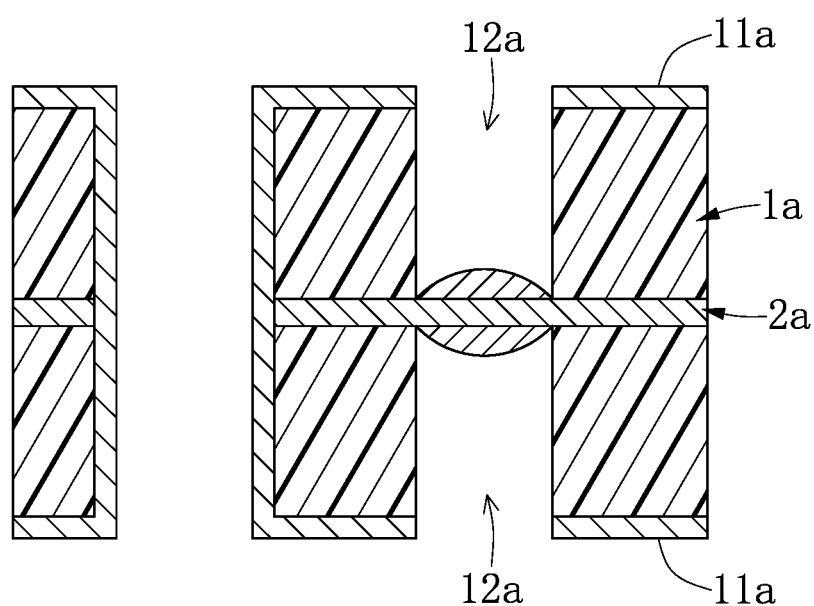
FIG. 1 is a cross-sectional view showing a conventional electroplating method of a circuit board.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 2 to FIG. 7, a first embodiment of the present disclosure provides an electroplating method of a circuit board. In the present embodiment, the drawings only show a unit portion of the circuit board for the sake of brevity. The electroplating method in the present embodiment includes steps S101-S105 as follows.

Figure 2:
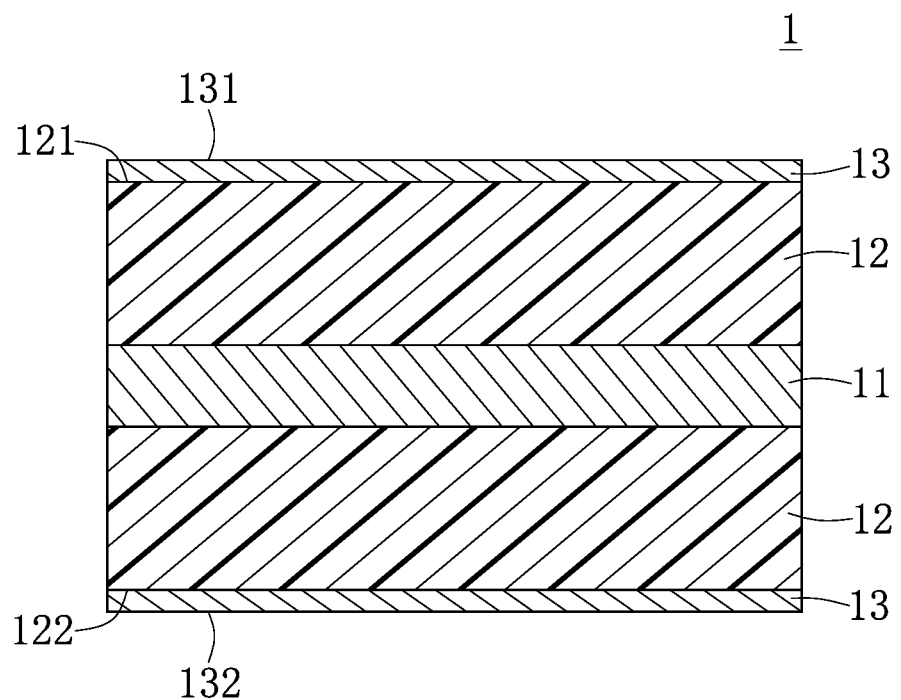
FIG. 2 is a cross-sectional view showing step S101 of an electroplating method of a circuit board according to a first embodiment of the present disclosure.

As shown in FIG. 2, the step S101 is implemented by providing a multi-layer board 1. The multi-layer board 1 has a first board surface 131 and a second board surface 132 opposite to the first board surface 131, and the multi-layer board 1 includes a conductive layer 11 embedded therein. A thickness of the multi-layer board 1 in the present embodiment is larger than 0.3 mm, but the present disclosure is not limited thereto.

Moreover, the multi-layer board 1 includes an insulating portion 12 and two metal layers 13. The conductive layer 11 is embedded in the insulating portion 12, and the conductive layer 11 is preferably arranged in a middle portion of the multi-layer board 1, but the present disclosure is not limited thereto. The two metal layers 13 are respectively disposed on a top surface 121 and a bottom surface 122 of the insulating portion 12, and outer surfaces of the two metal layers 13 are respectively defined as the first board surface 131 and the second board surface 132.

Specifically, the insulating portion 12 in the present embodiment is made of a preimpregnated material that can be a glass fiber prepreg, a carbon fiber prepreg, an epoxy resin, or other materials according to strength requirements. The insulating portion 12 can be made of a soft material. For example, a larger part of the insulating portion 12 can be made of polyester (PET) or polyimide (PI), and excludes any glass fibers or any carbon fibers. Moreover, the metal layer 13 and the conductive layer 11 each can be formed by a metal foil (e.g., a copper foil). The multi-layer board 1 of the present embodiment can be provided according to the above description, but the present disclosure is not limited thereto.

Figure 3A:
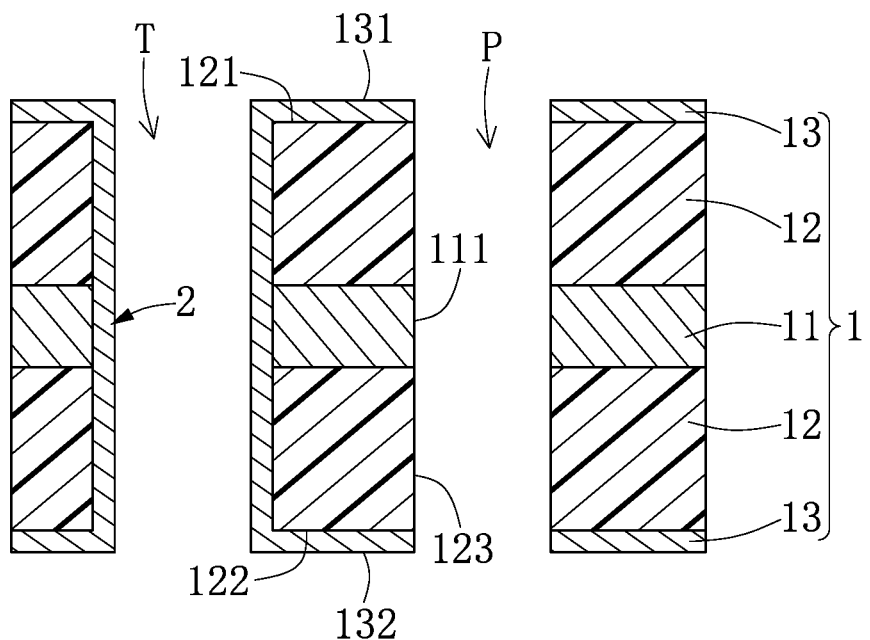
FIG. 3A is a cross-sectional view showing step S102 of the electroplating method according to the first embodiment of the present disclosure.
Figure 3B:
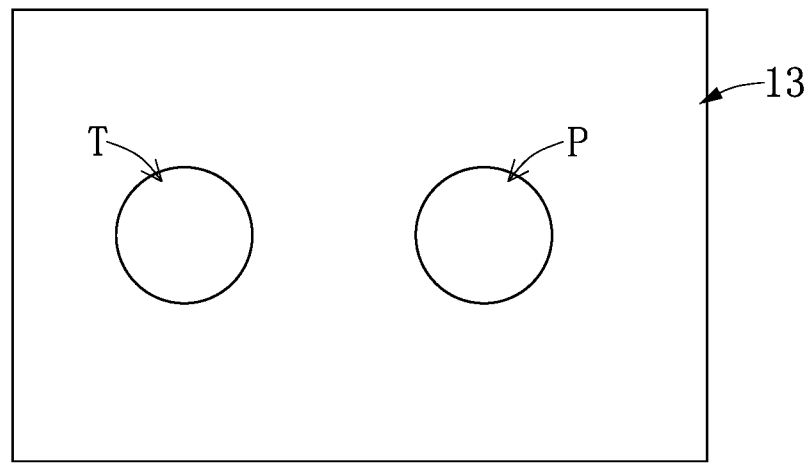
FIG. 3B is a top view of FIG. 3A.

As shown in FIG. 3A and FIG. 3B, the step S102 is implemented by forming a thru-hole T and a penetrating hole P in the multi-layer board 1 and forming a conductive portion 2 on an inner wall defining the thru-hole T and connected to the conductive layer 11. Each of the thru-hole T and the penetrating hole P penetrate through the multi-layer board 1 from the first board surface 131 to the second board surface 132, and the penetrating hole P is located at one side of the thru-hole T. A cross section of the penetrating hole P is in a circular shape, and an annular portion of the conductive layer 11 exposed from the penetrating hole P is defined as an electroplated region 111. Moreover, a depth of the penetrating hole P, which is equal to a thickness of the multi-layer board 1, in the present embodiment is larger than a diameter of the penetrating hole P, thereby preventing the penetrating hole P from being incompletely electroplated.

Specifically, the thru-hole T and the penetrating hole P are each formed to penetrate through the two metal layers 13, the insulating portion 12, and the conductive layer 11. The insulating portion 12 includes an inner surface 123 defining part of the penetrating hole P, and the electroplated region 111 is arranged in a middle portion of the penetrating hole P. In other words, the inner surface 123 of the insulating portion 12 and the electroplated region 111 jointly define a larger part of the penetrating hole P.

It should be noted that, the cross section of the penetrating hole P in the present embodiment is limited to be in a circular shape for the implementation of the following steps. That is to say, a penetrating hole having a non-circular cross section is not the penetrating hole P of the present embodiment, and cannot be applied to the electroplating method of the present embodiment. Moreover, the thru-hole T and the penetrating hole P in the present embodiment are formed by mechanical drilling, so that the efficiency of forming the thru-hole T and the penetrating hole P in the multi-layer board 1 can be effectively increased. That is to say, the multi-layer board 1 formed with a penetrating hole by laser drilling (and mechanical drilling) has a production efficiency lower than that in the step S102 of the present embodiment, and is not regarded as being formed by the step S102 of the present embodiment.

Figure 3C:
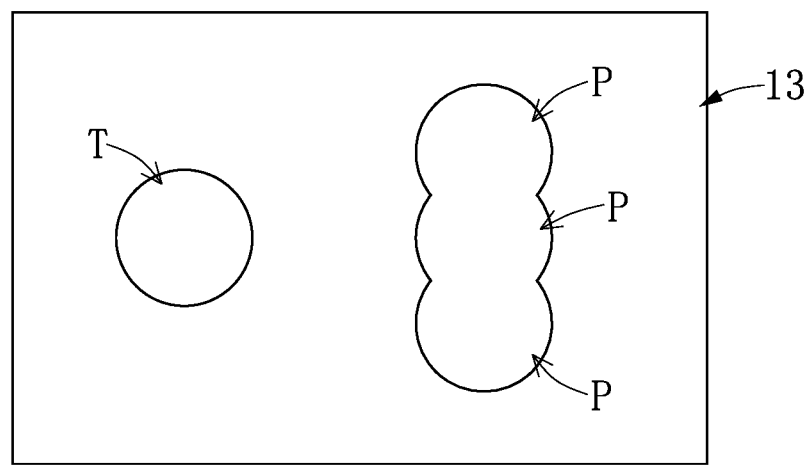
FIG. 3C is a top view of FIG. 3A in another configuration.

In addition, FIG. 3B shows that the multi-layer board 1 is formed with one penetrating hole P, but the present disclosure is not limited thereto. For example, as shown in FIG. 3C, the multi-layer board 1 is formed with a plurality of penetrating holes P that are in spatial communication with each other and partially overlap with each other so as to form an elongated shape. The penetrating holes P in other embodiments of the present disclosure can be jointly formed in other shapes (e.g., an L shape or a U shape). Accordingly, as shown in FIG. 3B and FIG. 3C, the multi-layer board 1 can be formed with at least one penetrating hole P. Furthermore, the shape of the at least one penetrating hole P of the multi-layer board 1 can be changed according to design requirements. For example, the at least one penetrating hole P can be in an elongated shape or an L shape.

Figure 4:
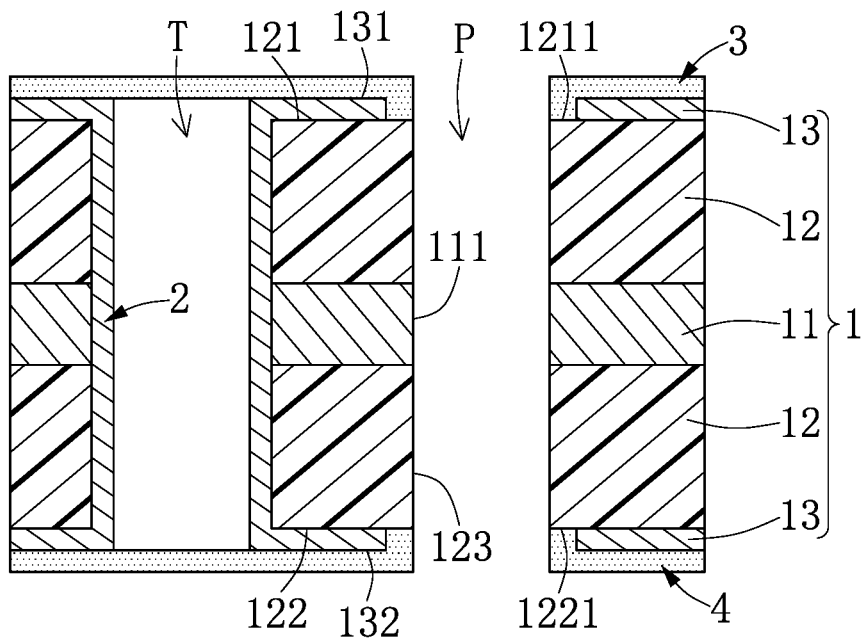
FIG. 4 is a cross-sectional view showing step S103 of the electroplating method according to the first embodiment of the present disclosure.

As shown in FIG. 4, the step S103 is implemented by forming a first reserved region 1211 and a second reserved region 1221 respectively on the top surface 121 and the bottom surface 122 of the insulating portion 12, in which the first reserved region 1211 is exposed from the corresponding metal layer 13 (e.g., the metal layer 13 on the top surface 121 of the insulating portion 12 shown in FIG. 4) and is connected to the inner surface 123, and the second reserved region 1221 is exposed from the corresponding metal layer 13 (e.g., the metal layer 13 on the bottom surface 122 of the insulating portion 12 shown in FIG. 4) and is connected to the inner surface 123.

Moreover, a first protecting layer 3 is formed on and covers the first board surface 131 and the first reserved region 1211 of the multi-layer board 1, and a second protecting layer 4 is formed on and covers the second board surface 132 and the second reserved region 1221 of the multi-layer board 1. A portion of the first protecting layer 3 covering the first reserved region 1211 and a portion of the second protecting layer 4 covering the second reserved region 1221 each have an inner edge that is flush with the inner surface 123 of the insulating portion 12. In the present embodiment, the first protecting layer 3 and the second protecting layer 4 can each be an anti-etching dry film, a photo resist, or other insulating materials, but the present disclosure is not limited thereto.

Figure 5:
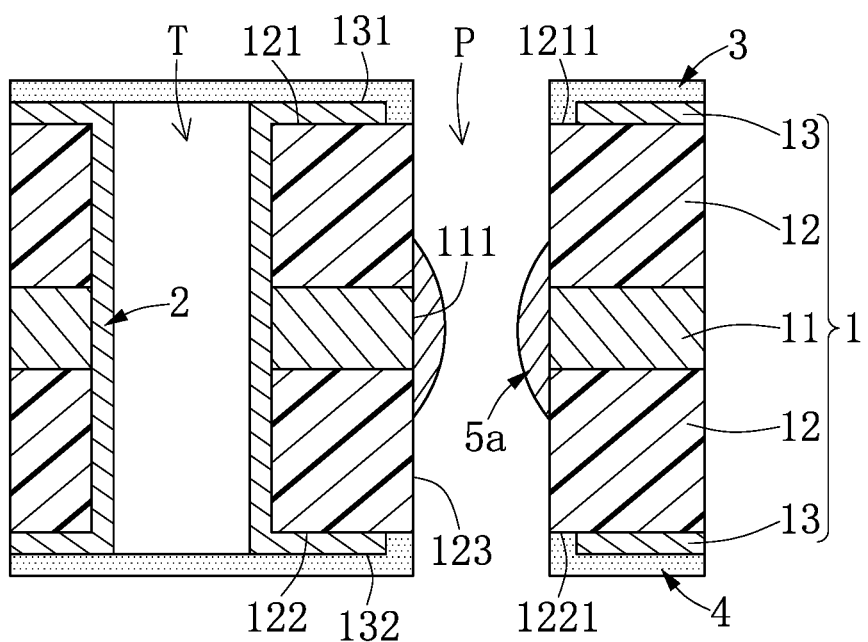
FIG. 5 and FIG. 6 are cross-sectional views showing step S104 of the electroplating method according to the first embodiment of the present disclosure.
Figure 6:
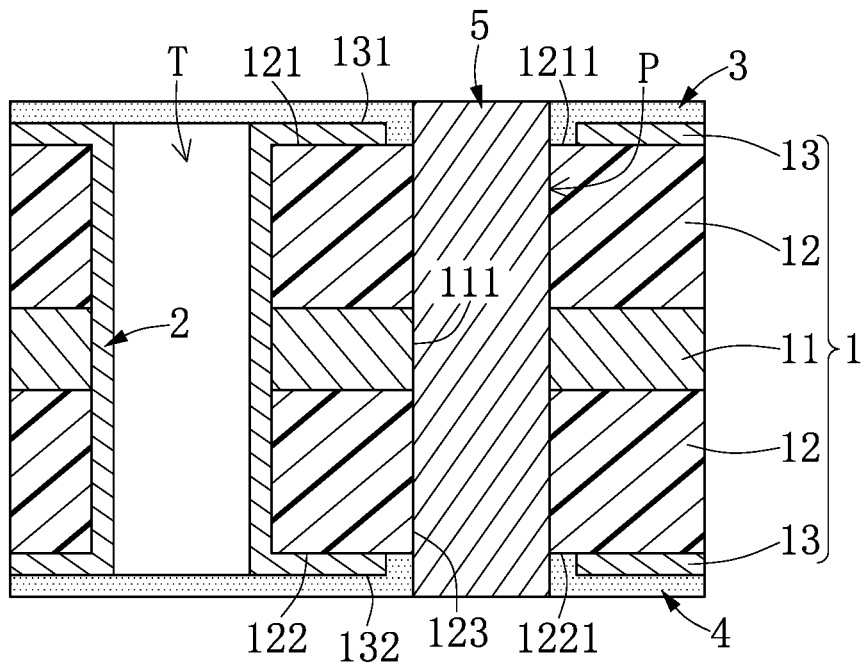

As shown in FIG. 5 and FIG. 6, the step S104 is implemented by applying a current to the conductive portion 2 so as to electroplate the electroplated region 111 to form a metal post 5 that fills the penetrating hole P and connects to the electroplated region 111. The metal post 5 in the present embodiment is substantially and gaplessly connected to the entire inner surface 123 of the insulating portion 12 and the electroplated region 111. Moreover, the metal post 5 is configured to dissipate heat energy, but the present disclosure is not limited thereto.

Specifically, before the electroplated region 111 is electroplated (or before the metal post 5 is formed), the first protecting layer 3 covering the first reserved region 1211 and the second protecting layer 4 covering the second reserved region 1221 are formed by the step S103, thereby effectively preventing a metal nodule (e.g., a copper nodule) from being formed on edges of the penetrating hole P of the multi-layer board 1.

Figure 7:
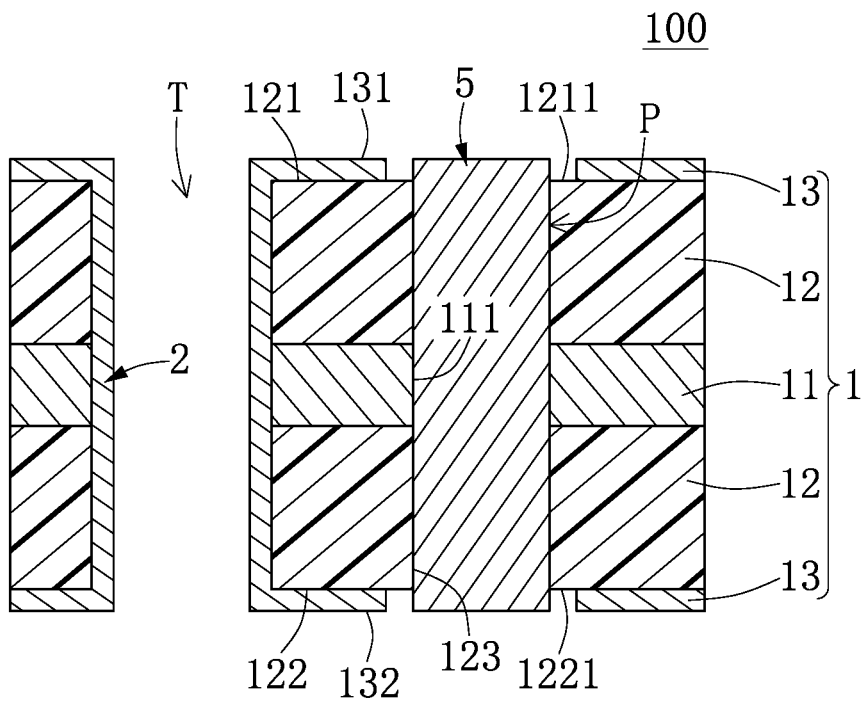
FIG. 7 is a cross-sectional view showing step S105 of the electroplating method according to the first embodiment of the present disclosure.

As shown in FIG. 7, the step S105 is implemented by removing the first protecting layer 3 and the second protecting layer 4, and grinding two opposite end portions of the metal post 5 that respectively protrude from the first board surface 131 and the second board surface 132 so as to allow two opposite outer surfaces of the metal post 5 to be respectively flush with the first board surface 131 and the second board surface 132, thereby obtaining a circuit board 100.

It should be noted that, any of the steps S101-S105 of the electroplating method in the present embodiment can be canceled, changed, or adjusted according to design requirements. That is to say, the electroplating method of the present disclosure is not limited to the above description.

Moreover, the present embodiment also provides a circuit board 100 shown in FIG. 7 that is manufactured by implementing the electroplating method. Since the structure of the circuit board 100 has been substantially disclosed in the above description, the structure of the circuit board 100 will not be described again in the present embodiment.

Second Embodiment

Referring to FIG. 8 to FIG. 14, a second embodiment of the present disclosure provides an electroplating method of a circuit board. The present embodiment is similar to the first embodiment, so that the same features of the two embodiments are selectively disclosed in the following description, and the difference between the two embodiments is disclosed as follows.

Figure 8:
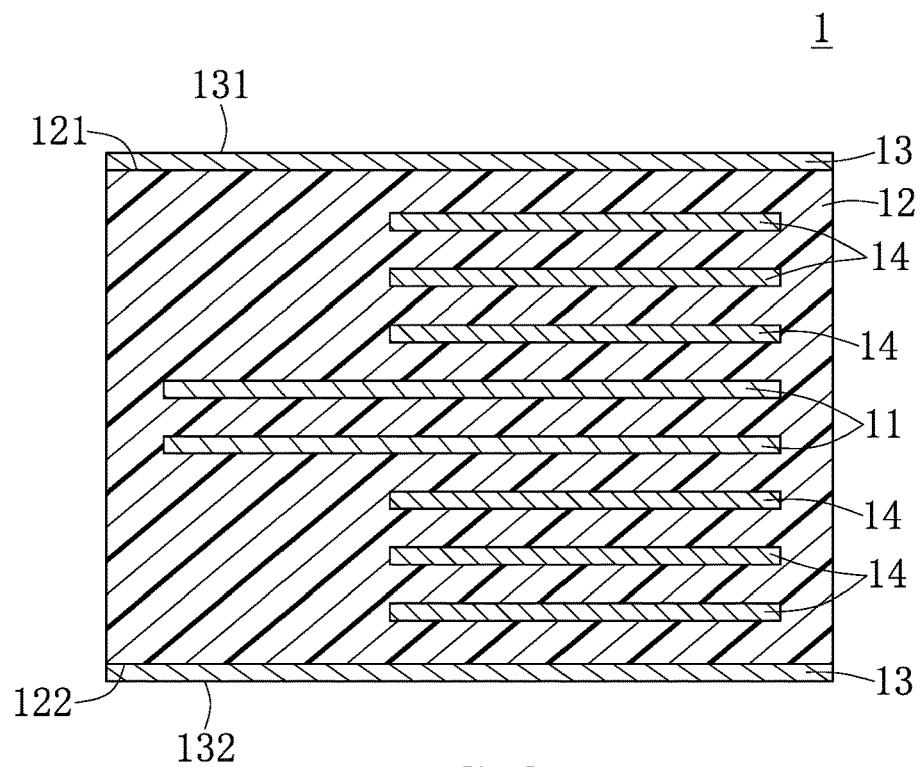
FIG. 8 is a cross-sectional view showing step S201 of an electroplating method of a circuit board according to a second embodiment of the present disclosure.

As shown in FIG. 8, the step S201 is implemented by providing a multi-layer board 1. The multi-layer board 1 has a first board surface 131 and a second board surface 132 opposite to the first board surface 131, and the multi-layer board 1 includes a plurality of conductive layers 11 and a plurality of circuit layers 14 embedded therein. The circuit layers 14 are respectively arranged at two opposite outer sides of the conductive layers 11. A thickness of the multi-layer board 1 in the present embodiment is larger than 0.3 mm, but the present disclosure is not limited thereto.

Moreover, the multi-layer board 1 includes an insulating portion 12 and two metal layers 13. The conductive layers 11 and the circuit layers 14 are spaced apart from each other and are embedded in the insulating portion 12, and the conductive layers 11 are preferably arranged in a middle portion of the multi-layer board 1, but the present disclosure is not limited thereto. The two metal layers 13 are respectively disposed on a top surface 121 and a bottom surface 122 of the insulating portion 12, and outer surfaces of the two metal layers 13 are respectively defined as the first board surface 131 and the second board surface 132.

Figure 9:
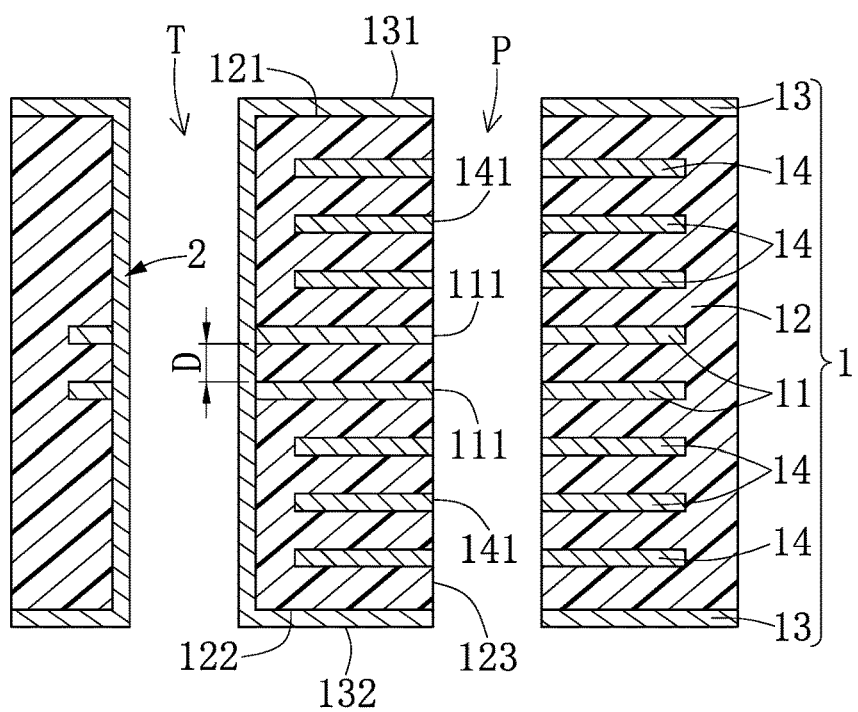
FIG. 9 is a cross-sectional view showing step S202 of the electroplating method according to the second embodiment of the present disclosure.

As shown in FIG. 9, the step S202 is implemented by forming a thru-hole T and a penetrating hole P in the multi-layer board 1 and forming a conductive portion 2 on an inner wall defining the thru-hole T and connected to the conductive layers 11. The conductive portion 2 is electrically isolated from the circuit layers 14. Each of the thru-hole T and the penetrating hole P penetrate through the multi-layer board 1 from the first board surface 131 to the second board surface 132, and the penetrating hole P is located at one side of the thru-hole T. A cross section of the penetrating hole P is in a circular shape, and an annular portion of each of the conductive layers 11 exposed from the penetrating hole P is defined as an electroplated region 111. An annular portion of each of the circuit layers 14 exposed from the penetrating hole P is defined as an attached region 141. Moreover, a depth of the penetrating hole P in the present embodiment, which is equal to a thickness of the multi-layer board 1, is larger than a diameter of the penetrating hole P, thereby preventing the penetrating hole P from being incompletely electroplated.

Specifically, the thru-hole T and the penetrating hole P are each formed to penetrate through the two metal layers 13, the insulating portion 12, the conductive layers 11, and the circuit layers 14. The insulating portion 12 includes an inner surface 123 defining part of the penetrating hole P, the electroplated regions 111 are arranged in a middle portion of the penetrating hole P, and any two of the electroplated regions 111 adjacent to each other have a distance D there-between that is within a range of 50-150 µm. In other words, the inner surface 123 of the insulating portion 12, the electroplated regions 111 of the conductive layers 11, and the attached regions 141 of the circuit layers 14 jointly define a larger part of the penetrating hole P.

Figure 10:
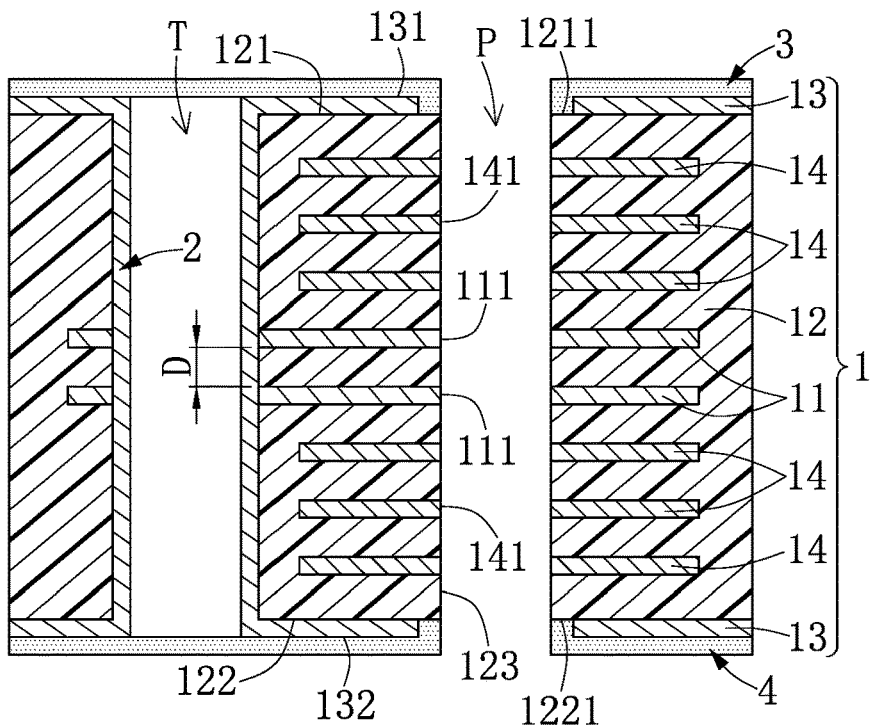
FIG. 10 is a cross-sectional view showing step S203 of the electroplating method according to the second embodiment of the present disclosure.

As shown in FIG. 10, the step S203 is implemented by forming a first reserved region 1211 and a second reserved region 1221 respectively on the top surface 121 and the bottom surface 122 of the insulating portion 12, in which the first reserved region 1211 is exposed from the corresponding metal layer 13 (e.g., the metal layer 13 on the top surface 121 of the insulating portion 12 shown in FIG. 10) and is connected to the inner surface 123, and the second reserved region 1221 is exposed from the corresponding metal layer 13 (e.g., the metal layer 13 on the bottom surface 122 of the insulating portion 12 shown in FIG. 10) and is connected to the inner surface 123.

Moreover, a first protecting layer 3 is formed on and covers the first board surface 131 and the first reserved region 1211 of the multi-layer board 1, and a second protecting layer 4 is formed on and covers the second board surface 132 and the second reserved region 1221 of the multi-layer board 1. A portion of the first protecting layer 3 covering the first reserved region 1211 and a portion of the second protecting layer 4 covering the second reserved region 1221 each have an inner edge that is flush with the inner surface 123 of the insulating portion 12. In the present embodiment, the first protecting layer 3 and the second protecting layer 4 can each be an anti-etching dry film, a photo resist, or other insulating materials, but the present disclosure is not limited thereto.

In addition, in other embodiments of the present disclosure, the multi-layer board 1 can be formed with a plurality of penetrating holes P that are in spatial communication with each other and partially overlap with each other so as to form an elongated shape. The penetrating holes P in other embodiments of the present disclosure can be jointly formed in other shapes (e.g., an L shape or a U shape). Accordingly, the multi-layer board 1 can be formed with at least one penetrating hole P. Furthermore, the shape of the at least one penetrating hole P of the multi-layer board 1 can be changed according to design requirements. For example, the at least one penetrating hole P can be in an elongated shape or an L shape.

Figure 11:
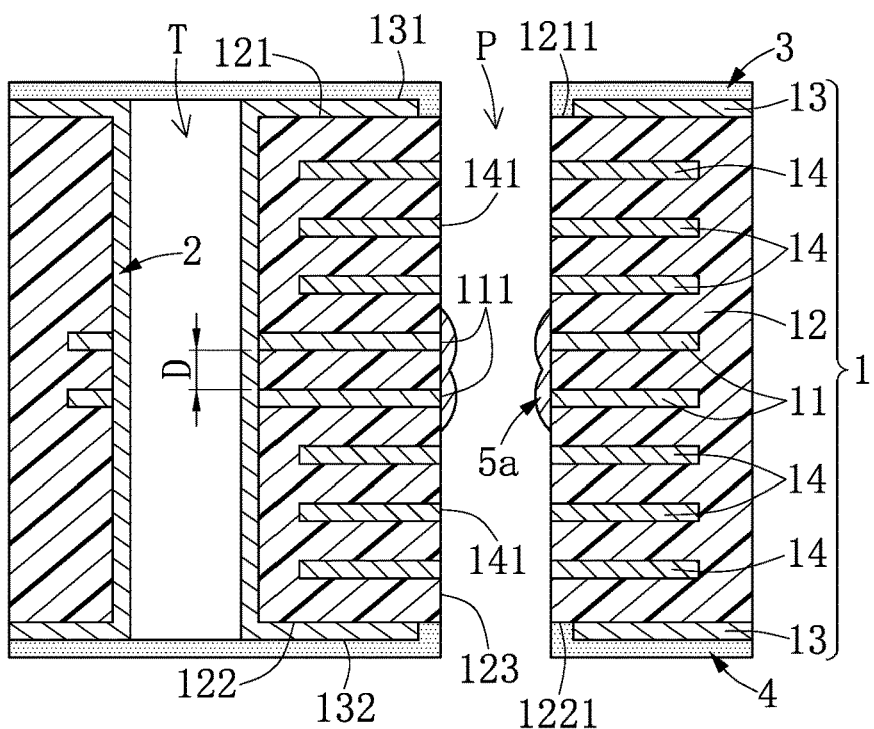
FIG. 11 to FIG. 13 are cross-sectional views showing step S204 of the electroplating method according to the second embodiment of the present disclosure.
Figure 12:
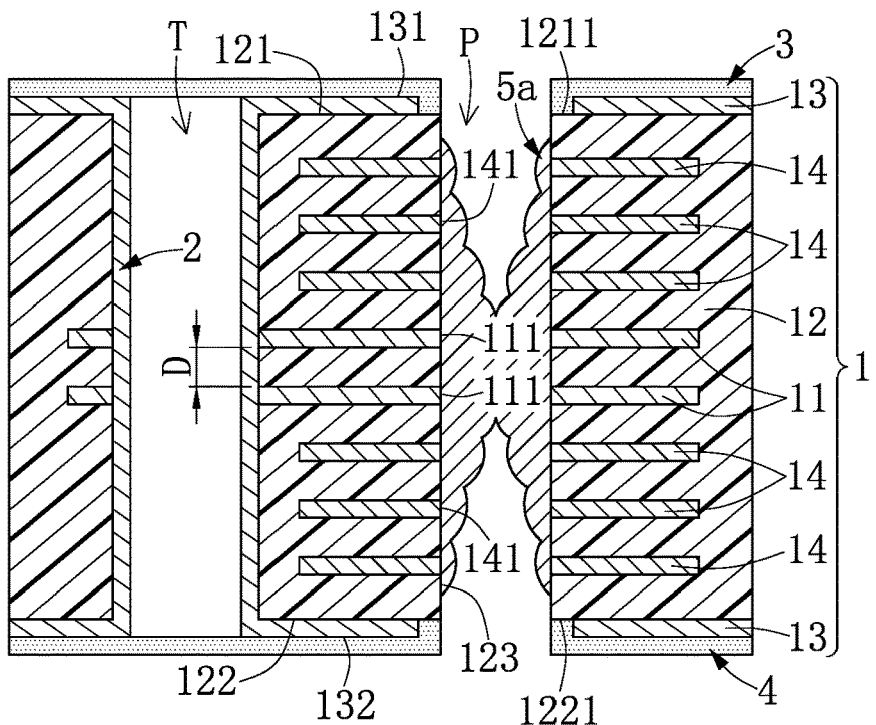
Figure 13:
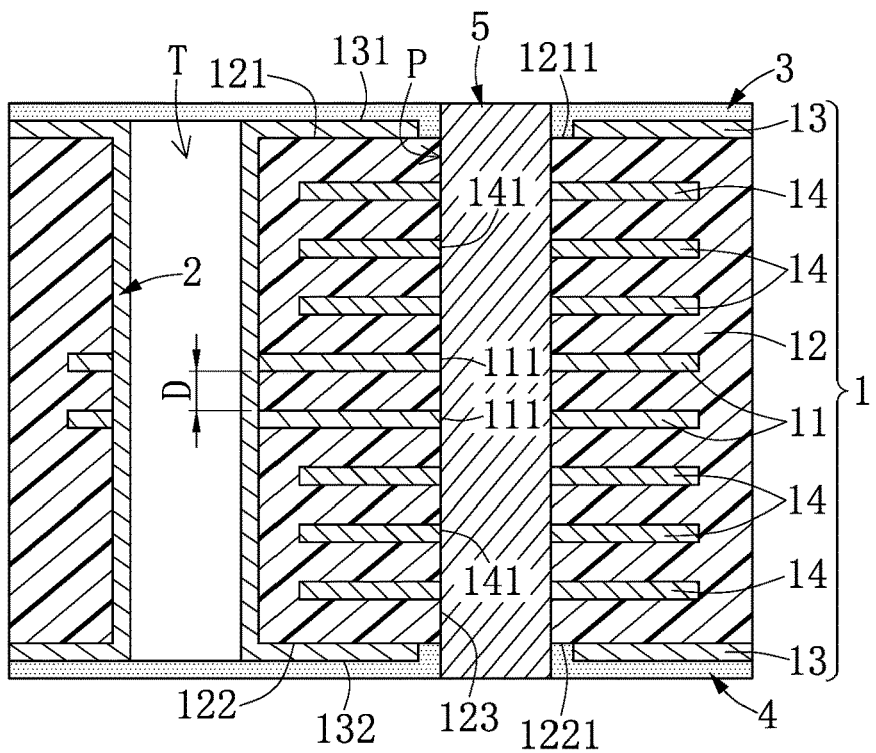

As shown in FIG. 11 to FIG. 13, the step S204 is implemented by applying a current to the conductive portion 2 so as to electroplate the electroplated region 111 to form a metal post 5 that fills the penetrating hole P and is connected to the electroplated regions 111 and the attached regions 141. The metal post 5 in the present embodiment is substantially and gaplessly connected to the entire the inner surface 123 of the insulating portion 12, the electroplated regions 111, and the attached regions 141. Moreover, the metal post 5 is configured to dissipate heat energy, but the present disclosure is not limited thereto.

Specifically, before the electroplated regions 111 are electroplated (or before the metal post 5 is formed), the first protecting layer 3 covering the first reserved region 1211 and the second protecting layer 4 covering the second reserved region 1221 are formed by the step S203, thereby effectively preventing a metal nodule (e.g., a copper nodule) from being formed on edges of the penetrating hole P of the multi-layer board 1.

Furthermore, in the electroplating of the electroplated regions 111, a metal portion 5a is formed on the electroplated regions 111, and then extends to the attached regions 141, so that the metal portion 5a can simultaneously extend from the electroplated regions 111 and the attached regions 141 to form the metal post 5. Accordingly, the step S204 is implemented by using the electroplated regions 111 and the attached regions 141, thereby effectively increasing the forming speed of the metal post 5.

Figure 14:
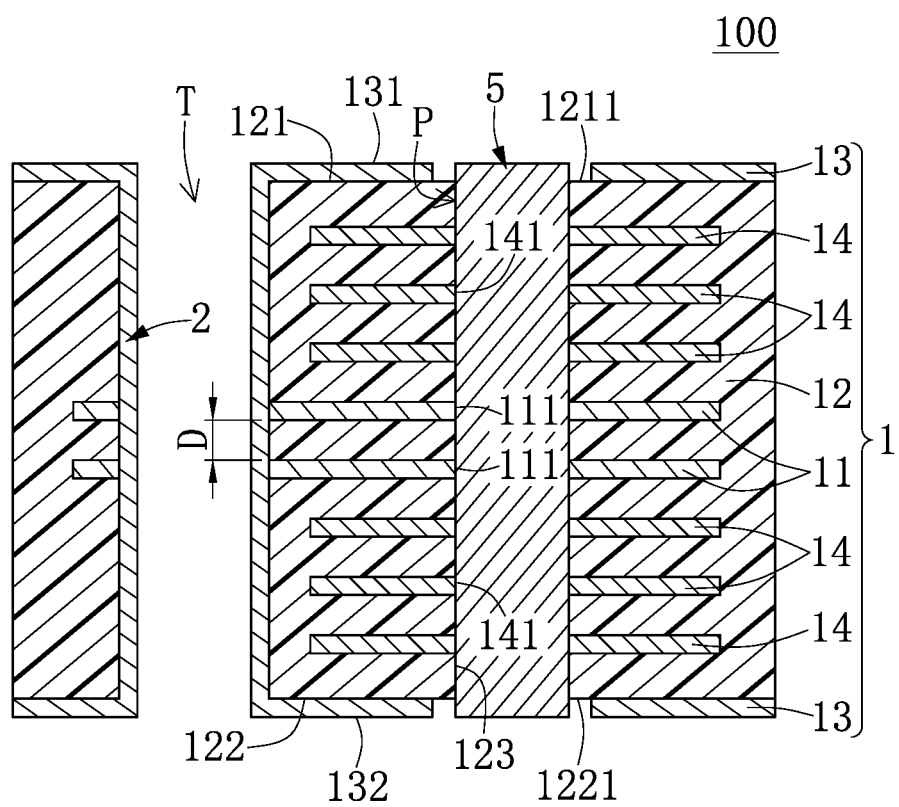
FIG. 14 is a cross-sectional view showing step S205 of the electroplating method according to the second embodiment of the present disclosure.

As shown in FIG. 14, the step S205 is implemented by removing the first protecting layer 3 and the second protecting layer 4, and grinding two opposite end portions of the metal post 5 that respectively protrude from the first board surface 131 and the second board surface 132 so as to allow two opposite outer surfaces of the metal post 5 to be respectively flush with the first board surface 131 and the second board surface 132, thereby obtaining a circuit board 100.

It should be noted that, any of the steps S201-S205 of the electroplating method in the present embodiment can be canceled, changed, or adjusted according to design requirements. That is to say, the electroplating method of the present disclosure is not limited to that disclosed in the above description.

Moreover, the present embodiment also provides a circuit board 100 shown in FIG. 14 that is manufactured by implementing the electroplating method. Since the structure of the circuit board 100 has been substantially disclosed in the above description, the structure of the circuit board 100 is not described again in the present embodiment.

In conclusion, the electroplating method and the circuit board manufactured by the same in the present embodiment can each allow the multi-layer board to be directly formed with a circular penetrating hole, and the at least one electroplated region in the penetrating hole can be electroplated to form a metal post that is entirely filled in the penetrating hole. Accordingly, the electroplating method of the present disclosure can be implemented to directly form a circular penetrating hole in the multi-layer board, so that the production efficiency of the circuit board can be effectively increased, and the manufacturing cost of the circuit board can be reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An electroplating method of a circuit board, comprising:
providing a multi-layer board, wherein the multi-layer board has a first board surface and a second board surface opposite to the first board surface, the multi-layer board includes a plurality of conductive layers embedded therein and a plurality of circuit layers embedded therein, and the circuit layers are respectively arranged at two opposite outer sides of the conductive layers;
forming a thru-hole and at least one penetrating hole in the multi-layer board, and forming a conductive portion on an inner wall defining the thru-hole and connected to the conductive layers, wherein each of the thru-hole and the at least one penetrating hole penetrates through the multi-layer board from the first board surface to the second board surface, the conductive portion is electrically isolated from the circuit layers, a cross section of the at least one penetrating hole is in a circular shape, a depth of the at least one penetrating hole is larger than a diameter of the at least one penetrating hole, and the at least one penetrating hole is located at one side of the thru-hole, and wherein an annular portion of each of the conductive layers exposed from the at least one penetrating hole is defined as an electroplated region, and an annular portion of each of the circuit layers exposed from the at least one penetrating hole is defined as an attached region; and
electroplating the electroplated regions to form a metal post by applying a current to the conductive portion, wherein the at least one penetrating hole is entirely filled by the metal post, and the metal post is connected to the electroplated regions and the attached regions;
wherein the electroplated regions are arranged in a middle portion of the at least one Penetrating hole.

2. The electroplating method according to claim 1, wherein in the electroplating of the electroplated regions, a metal portion is formed on the electroplated regions, and then extends to the attached regions, so that the metal portion simultaneously extends from the electroplated regions and the attached regions to form the metal post.

3. The electroplating method according to claim 1, wherein the multi-layer board includes an insulating portion and two metal layers, the conductive layers and the circuit layers are spaced apart from each other and are embedded in the insulating portion, the two metal layers are respectively disposed on a top surface and a bottom surface of the insulating portion, and outer surfaces of the two metal layers are respectively defined as the first board surface and the second board surface.

4. The electroplating method according to claim 3, wherein the insulating portion includes an inner surface defining part of the at least one penetrating hole, and wherein before the electroplated regions are electroplated, the top surface of the insulating portion has a first reserved region that is exposed from the corresponding metal layer and is connected to the inner surface, the bottom surface of the insulating portion has a second reserved region that is exposed from the corresponding metal layer and is connected to the inner surface, a first protecting layer is formed on and covers the first board surface and the first reserved region, and a second protecting layer is formed on and covers the second board surface and the second reserved region.

5. The electroplating method according to claim 4, wherein a portion of the first protecting layer covering the first reserved region and a portion of the second protecting layer covering the second reserved region each have an inner edge that is flush with the inner surface of the insulating portion.

6. The electroplating method according to claim 1, wherein a thickness of the multi-layer board is larger than 0.3 mm, and any two of the electroplated regions adjacent to each other have a distance there-between that is within a range of 50-150 µm.

7. A circuit board, manufactured by the electroplating method according to claim 1.

8. An electroplating method of a circuit board, comprising:
   providing a multi-layer board, wherein the multi-layer board has a first board surface and a second board surface opposite to the first board surface, and the multi-layer board includes a conductive layer embedded therein;
   forming a thru-hole and at least one penetrating hole in the multi-layer board, and forming a conductive portion on an inner wall defining the thru-hole and connected to the conductive layer, wherein each of the thru-hole and the at least one penetrating hole penetrate through the multi-layer board from the first board surface to the second board surface, a cross section of the at least one penetrating hole is in a circular shape, a depth of the at least one penetrating hole is larger than a diameter of the at least one penetrating hole, and the at least one penetrating hole is located at one side of the thru-hole, and wherein an annular portion of the conductive layer exposed from the at least one penetrating hole is defined as an electroplated region; and
   electroplating the electroplated region to form a metal post by applying a current to the conductive portion, wherein the at least one penetrating hole is entirely filled by the metal post, and the metal post is connected to the electroplated region;
   wherein the electroplated region is arranged in a middle portion of the at least one Penetrating hole.

9. The electroplating method according to claim 8, wherein a thickness of the multi-layer board is larger than 0.3 mm, and the thru-hole and the at least one penetrating hole are formed by a mechanical drilling.

10. The electroplating method according to claim 8, wherein the multi-layer board includes an insulating portion and two metal layers, the conductive layer is embedded in the insulating portion, the two metal layers are respectively disposed on a top surface and a bottom surface of the insulating portion, outer surfaces of the two metal layers are respectively defined as the first board surface and the second board surface, and the insulating portion includes an inner surface defining part of the at least one penetrating hole, and wherein before the electroplated region is electroplated, the top surface of the insulating portion has a first reserved region that is exposed from the corresponding metal layer and is connected to the inner surface, the bottom surface of the insulating portion has a second reserved region that is exposed from the corresponding metal layer and is connected to the inner surface, a first protecting layer is formed on and covers the first board surface and the first reserved region, and a second protecting layer is formed on and covers the second board surface and the second reserved region.

11. An electroplating method of a circuit board, comprising:
   providing a multi-layer board, wherein the multi-layer board has a first board surface and a second board surface opposite to the first board surface, and the multi-layer board includes a conductive layer embedded therein;
   forming a thru-hole and at least one penetrating hole in the multi-layer board, and forming a conductive portion on an inner wall defining the thru-hole and connected to the conductive layer, wherein each of the thru-hole and the at least one penetrating hole penetrate through the multi-layer board from the first board surface to the second board surface, a cross section of the at least one penetrating hole is in a circular shape, a depth of the at least one penetrating hole is larger than a diameter of the at least one penetrating hole, and the at least one penetrating hole is located at one side of the thru-hole, and wherein an annular portion of the conductive layer exposed from the at least one penetrating hole is defined as an electroplated region; and
   electroplating the electroplated region to form a metal post by applying a current to the conductive portion, wherein the at least one penetrating hole is entirely filled by the metal post, and the metal post is connected to the electroplated region;
   wherein the multi-layer board includes an insulating portion and two metal layers, the conductive layer is embedded in the insulating portion, the two metal layers are respectively disposed on a top surface and a bottom surface of the insulating portion, outer surfaces of the two metal layers are respectively defined as the first board surface and the second board surface, and the insulating portion includes an inner surface defining part of the at least one penetrating hole, and wherein before the electroplated region is electroplated, the top surface of the insulating portion has a first reserved region that is exposed from the corresponding metal layer and is connected to the inner surface, the bottom surface of the insulating portion has a second reserved region that is exposed from the corresponding metal layer and is connected to the inner surface, a first protecting layer is formed on and covers the first board surface and the first reserved region, and a second protecting layer is formed on and covers the second board surface and the second reserved region.

* * * * *